(12) United States Patent
Cheng et al.

(10) Patent No.: US 6,890,829 B2
(45) Date of Patent: May 10, 2005

(54) FABRICATION OF ON-PACKAGE AND ON-CHIP STRUCTURE USING BUILD-UP LAYER PROCESS

(75) Inventors: Peng Cheng, Campbell, CA (US); Qing Ma, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/246,360

(22) Filed: Sep. 17, 2002

(65) Prior Publication Data

US 2003/0077871 A1 Apr. 24, 2003

Related U.S. Application Data

(63) Continuation of application No. 09/695,764, filed on Oct. 24, 2000, now abandoned.

(51) Int. Cl.[7] .............................................. H01L 21/20
(52) U.S. Cl. ....................................... 438/381; 257/531
(58) Field of Search ........................... 438/381; 257/531

(56) References Cited

U.S. PATENT DOCUMENTS

| | | | |
|---|---|---|---|
| 5,095,357 A | 3/1992 | Andoh et al. | 357/51 |
| 5,801,521 A | 9/1998 | Mizoguchi et al. | 323/282 |
| 6,083,802 A | 7/2000 | Wen et al. | 438/381 |
| 6,153,489 A | 11/2000 | Park et al. | 438/381 |
| 6,201,287 B1 | 3/2001 | Forbes | 257/528 |
| 6,218,729 B1 | 4/2001 | Zavrel, Jr. et al. | 257/698 |
| 6,274,937 B1 | 8/2001 | Ahn et al. | 257/777 |
| 6,303,423 B1 | 10/2001 | Lin | 438/238 |
| 6,423,570 B1 * | 7/2002 | Ma et al. | 438/106 |
| 6,573,822 B2 * | 6/2003 | Ma et al. | 336/223 |
| 2002/0070443 A1 * | 6/2002 | Mu et al. | 257/712 |
| 2002/0127780 A1 * | 9/2002 | Ma et al. | 438/127 |
| 2002/0190835 A1 * | 12/2002 | Ma et al. | 336/223 |

* cited by examiner

*Primary Examiner*—W. David Coleman
(74) *Attorney, Agent, or Firm*—Schwegman, Lundberg, Woessner & Kluth, P.A.

(57) ABSTRACT

The invention relates to a process of forming an on-chip package inductor. The process includes providing a substrate with at least one microelectronic device packaged therewith. As part of the inventive process, electrical communication is formed for the microelectronic device. The electrical communication includes at least two electrically conductive layers. As part of the inventive technology, the inductor is patterned on the substrate before, during, or after formation of the electrical communication. The inductor is connected to the at least one microelectronic device.

25 Claims, 9 Drawing Sheets

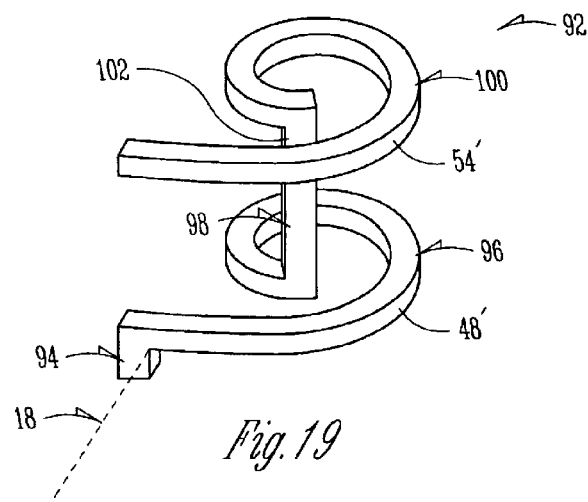
Fig. 19
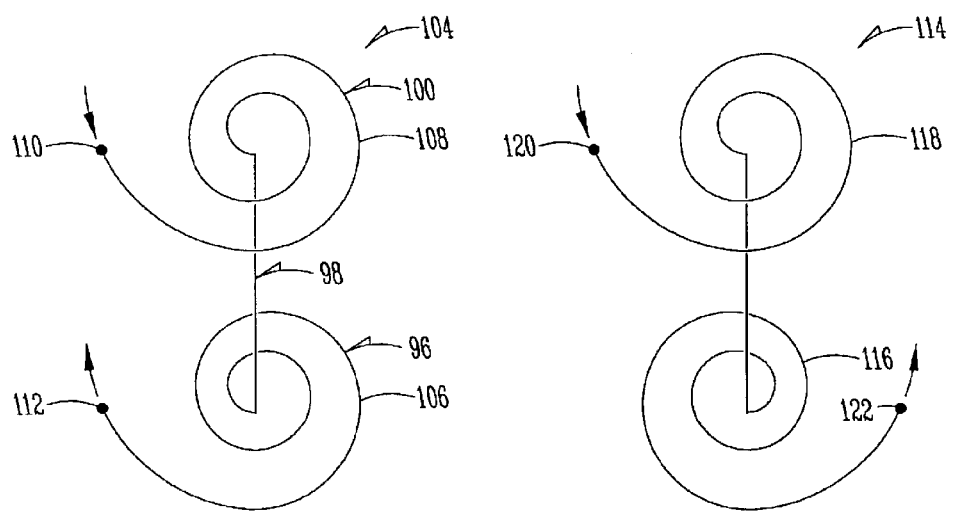
Fig. 20
Fig. 21

FABRICATION OF ON-PACKAGE AND ON-CHIP STRUCTURE USING BUILD-UP LAYER PROCESS

This application is a continuation of U.S. patent application Ser. No. 09/695,764, filed on Oct. 24, 2000, which is now abandoned.

BACKGROUND OF THE INVENTION

1. Field of the Invention

The present invention relates generally to integrated circuit fabrication. More particularly, the present invention relates to build-up layer technology that is used to fabricate on-package structures. In particular, the present invention relates to a process of fabricating an inductor during the build-up layer fabrication.

2. Description of Related Art

Electronic components such as inductors are impacted by the trend of miniaturization that adds challenges to continued high quality. For example inductors are required in miniaturized devices that may include a power regulator in an integrated circuit, or a component in a low power application such as a hand-held device. Due to effect of electrostatic noise that may be produced by an inductor, an efficient inductor may adversely impact on-silicon circuitry. Consequently, inductors are often supplied as discrete components and are mounted off chip. A disadvantage of of-chip mounting is that the stub length causes skew in the required response characteristics of the inductor or other device.

What is needed is a process of forming an inductor that overcomes the problems in the prior art.

BRIEF DESCRIPTION OF THE DRAWINGS

FIG. 19 is an elevational oblique view of a spiral coil inductor;

FIG. 20 is an elevational oblique schematic view of a counter coil;

FIG. 21 is an elevational oblique schematic view of a double coil;

DETAILED DESCRIPTION OF THE INVENTION

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1:
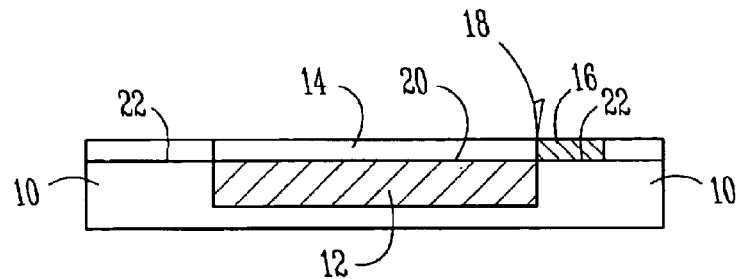
FIG. 1 is an elevational cross-section view of a semiconductor structure that is made according to the present invention.

FIG. 1 illustrates one embodiment of the present invention. Therein, a process of forming an inductor includes providing a substrate 10. Substrate 10 includes at least one microelectronic device 12 packaged therewith. Next, electrical communication 14 is formed such as wiring layers by using metallization techniques. One process of forming electrical communication 14 is with build-up later (BUL) technology. In this embodiment electrical communication 14 comprises at least two electrically conductive layers. Additionally, a front inductor 16 is patterned on substrate 10. In FIG. 1, front inductor 16 is illustrated as being formed at a boundary 18 between a front active surface of microelectronic die 12, and a front inactive surface 22 of substrate 10. Formation of front inductor 16 at boundary 18 is accomplished in order to minimize stub length between front inductor 16 and the microelectronic component within microelectronic device 12. Additionally, front inductor 16 is connected to electrical communication 14.

One embodiment of the present invention relates to masking front active surface 20 of microelectronic die 12. Masking may be done before, during, or after forming electrical communication 14.

Figure 2:
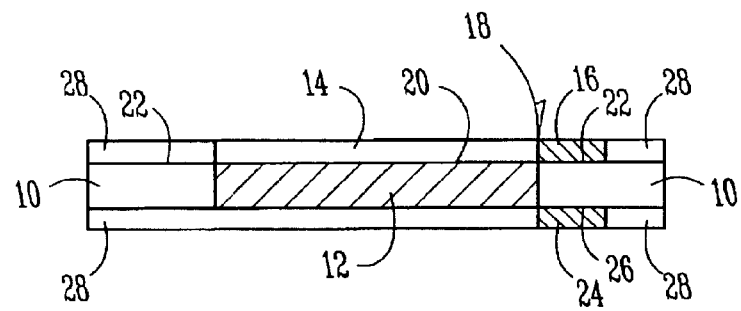
FIG. 2 is an elevational cross-section view of a semiconductor structure that includes a back-side inductor.

In another embodiment front inductor 16 is formed simultaneously while forming electrical communication 14. In this process, fabrication of electrical communication 14 is done with BUL technology that uses at least two electrically conductive layers. Preferably, at least one of the at least two electrically conductive layers is common to the electrical communication and the inductor. According to this embodiment, masking of front active surface 20 is not total, rather, is calculated to reduce processing operations.

Where short stub length is important, and where real estate on front inactive surface 22 is crowded, a back-surface inductor 24 may be formed as illustrated in FIG. 2. According to this embodiment, back-surface inductor 24 may be formed on the back surface 26 of substrate 10 while front active surface 20 is completely masked, isolated, or otherwise. In FIGS. 1 and 2 it may be seen that optionally non-functional BULs 28 may be present as incidental to the inventive process. By non-functional, it is not meant that non-functional BUL 28 has no usefulness. For example non-functional BUL 28 may provide both thermal and structural stability and may likewise provide a heat sink or heat pipe functionality. Additionally, wiring to pin-out connections may be incidental to the formation of electrical communication 14 over font inactive surface 22.

The present invention comprises the formation of both helical and spiral inductors according to the inventive process. For both the helical and spiral inductor processes, patterning thereof may be done while forming the at least two electrically conductive layers. A helical inductor may be classified as a substantially 3-dimensional structure, whereas a spiral inductor is a substantially 2-dimensional structure.

Illustrated below is a process of forming electrical communication 14 and at least one inductor according to the inventive process. The inventive process will be illustrated by the formation of an inductor at the boundary 18 as depicted in FIGS. 1 and 2. The following figures illustrate various views of the present invention. However, these figures are not meant to portray microelectronic assemblies in precise detail. Rather, these figures illustrate microelectronic assemblies in a manner to more clearly convey the concepts of the present invention. Additionally, elements common between the figures retain the same numeric designation.

Figure 3:
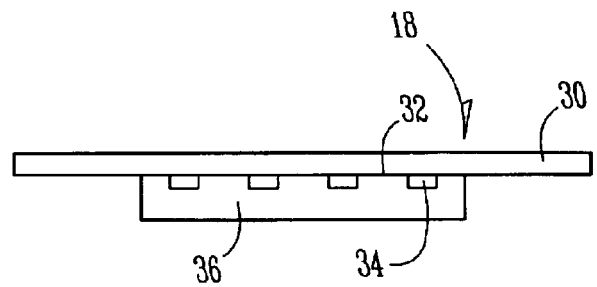
FIG. 3 is an elevational cross-section view of a semiconductor structure that illustrates a portion of the inventive process.

The present invention includes a packaging technology that fabricates BULs on a substrate that includes a packaged microelectronic device. The substrate has an expanded area larger than that of the microelectronic device. As shown in FIG. 3, a device 36 is provided with a film 30 that is abutted against a device active surface 32 (also referred to herein as front active surface 20) to protect device 36. Device active surface 32 has at least one electrical contact 34 disposed thereon. The electrical contact 34 makes connection with integrated circuitry within device 36. The film 30 is preferably a substantially flexible material, such as Kapton® polyimide film (E. I. du Pont de Nemours and Company, Wilmington, Del.), but may be made of any appropriate material, including metallic films. The film 30 may have a weak, thermally stable adhesive, such as silicone, which attaches to device active surface 32. This adhesive-type film may be applied prior to placing device 36 in a mold or other such equipment used for the encapsulation process. Film 30 may also be a non-adhesive film, such as a ETFE (ethylene-tetrafluoroethylene) or Teflon® film, which is held on device active surface 32 by an inner surface of the mold or other such equipment during the encapsulation process.

Figure 4:
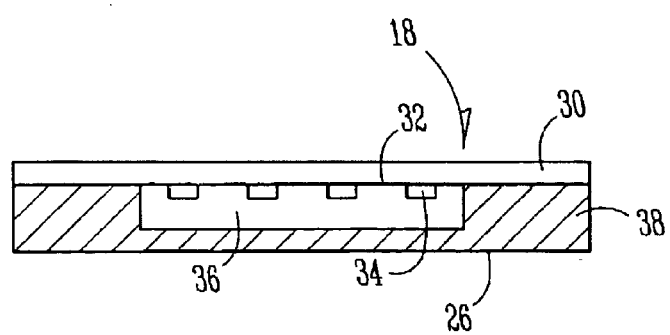
FIG. 4 is an elevational cross section view of the semiconductor structure depicted in FIG. 3 after further processing to encapsulate a device.

The device 36 is encapsulated with an encapsulation material 38, such as plastics, resins, epoxies, and the like, as shown in FIG. 4, that forms a back surface 26 of an integrated package. The encapsulation of the device 36 may be achieved by any known process, including but not limited to transfer and compression molding, and dispensing. The encapsulation material 38 provides mechanical rigidity, protects device 36 from contaminants, and provides surface area for the build-up of trace layers.

Figure 5:
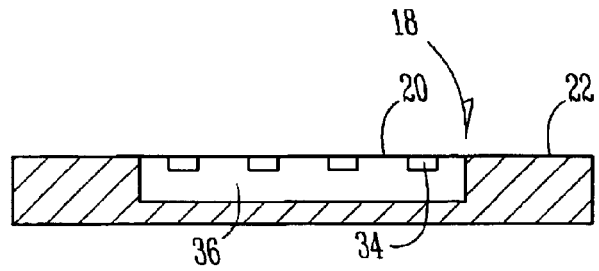
FIG. 5 is an elevational cross section view of the semiconductor structure depicted in FIG. 4 after further processing to expose active and inactive front surfaces.

Film 30 is removed, as shown in FIG. 5, to expose front active surface 20 and to form at least a front inactive surface 22 which may be substantially co-planar to front active surface 20. Front inactive surface 22 and front active surface 20 constitute the front surface of the encapsulated microelectronic die assembly, which will be utilized in further fabrication processes as additional surface area for the formation of BULs, such as dielectric material layers and conductive traces to form metallization and an inductor by the inventive process.

Figure 6:
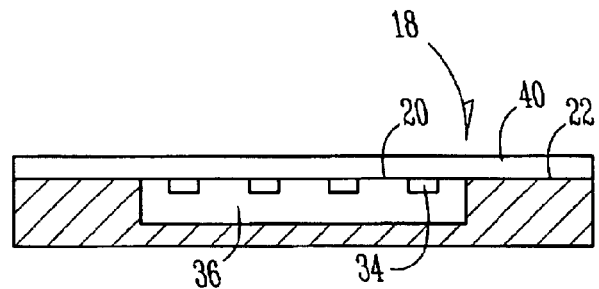
FIG. 6 is an elevational cross section view of the semiconductor structure depicted in FIG. 5 after further processing to form a first dielectric layer.

A first dielectric layer 40, such as epoxy resin, polyimide, bisbenzocyclobutene, and the like, is disposed over front active surface 20, electrical contacts 34, and front inactive surface 22, as shown in FIG. 6. The dielectric layers of the present invention are preferably filled epoxy resins available from Ibiden U.S.A. Corp., Santa Clara, Calif., U.S.A. and Ajinomoto U.S.A., Inc., Paramus, N.J., U.S.A. The formation of first dielectric layer 40 may be achieved by any known process, including but not limited to film lamination, spin coating, roll-coating, and spray-on deposition.

Figure 7:
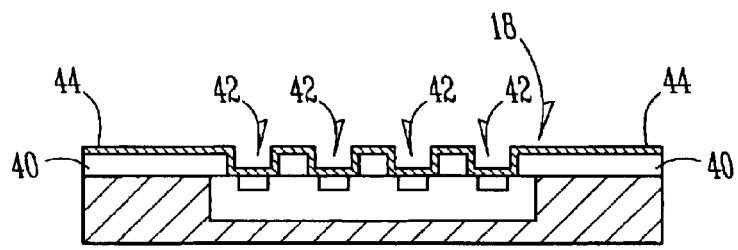
FIG. 7 is an elevational cross section view of the semiconductor structure depicted in FIG. 6 after further processing to form a first via and an optional seed layer.

As shown in FIG. 7, a first via 42 is formed through first dielectric layer 40. First via 42 may be formed by any method known in the art, including but not limited to laser drilling, photolithography, and, if first dielectric layer 40 is photoactive, forming first via 42 in the same manner that a photoresist mask is made in a photolithographic process, as known in the art. An exemplary semi-additive plating technique can involve depositing a first seed layer 44 on first dielectric layer 40, as seen in FIG. 7. First seed layer 44 may be formed by processes such as sputter-deposited or electroless-deposited metal, and may be a material such as such as a titanium/copper alloy.

Figure 8:
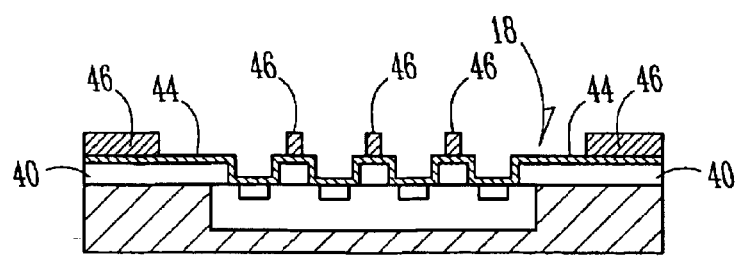
FIG. 8 is an elevational cross section view of the semiconductor structure depicted in FIG. 7 after further processing to pattern a mask.
Figure 9:
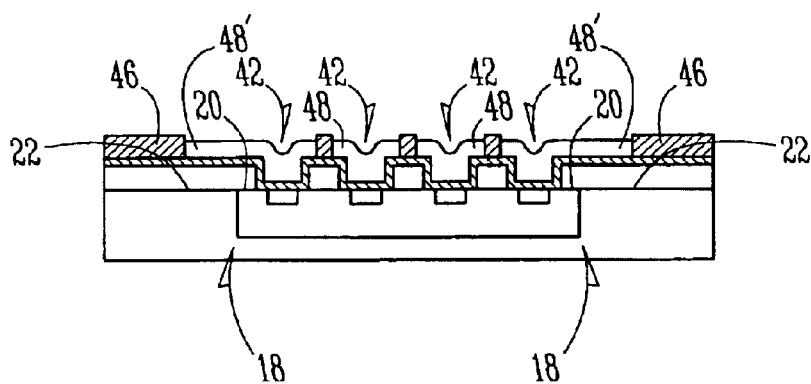
FIG. 9 is an elevational cross section view of the semiconductor structure depicted in FIG. 8 after further processing to form a first electrical trace.

FIG. 8 illustrates the formation of a first mask 46. First mask 46 is patterned on first seed layer 44 if it is present. Any number of processes may be used to form a trace in first via 42. One example is electrolytic plating of a layer of metal, such as copper, on first seed layer 44 exposed by open areas in first mask 46. A first conductive trace 48 is formed over first dielectric layer 40 and optional first seed layer 44, as shown in FIG. 9, wherein a portion of each of first conductive trace 48 extends into at least one of first via 42 to make electrical contact therewith. First conductive trace 48 may be made of any applicable conductive material, such as copper, aluminum, and alloys thereof. As shown in FIG. 9, at least one first conductive trace 48' extends across boundary 18 to be in contact with both front active surface 20 and front inactive surface 22. First conductive trace 48' is defined as a conductive trace that extends across boundary 18 and that may become a portions, such as a first level of an inductor structure. First conductive trace 48, 48' may be formed by any known technique, including but not limited to semi-additive plating and photolithographic techniques.

Figure 10:
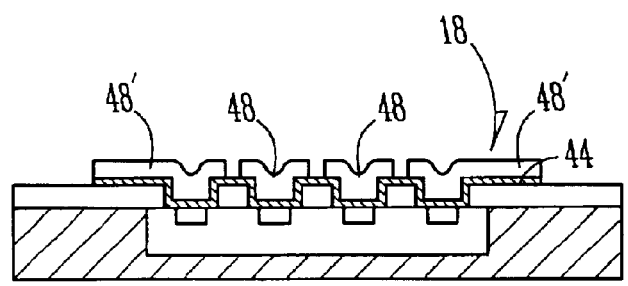
FIG. 10 is an elevational cross section view of the semiconductor structure depicted in FIG. 9 after further processing to remove excess material.

Following the formation of first conductive traces 48,48' first mask 46 is stripped and portions of first seed layer 44 not having first conductive trace 48 disposed thereon are etched away as illustrated in FIG. 10. Other methods of forming first conductive trace 48 will be apparent to those skilled in the art.

Figure 11:
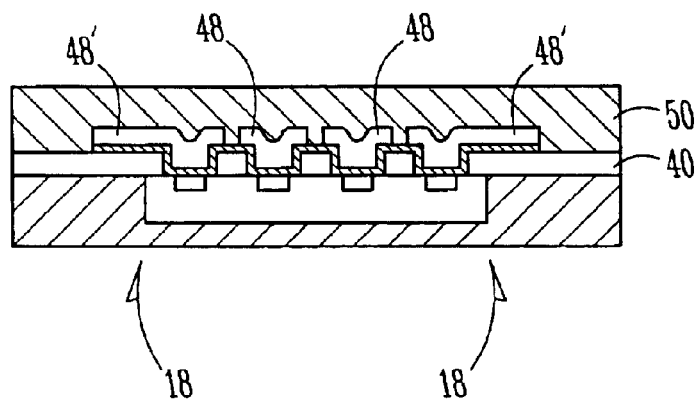
FIG. 11 is an elevational cross section view of the semiconductor structure depicted in FIG. 10 after further processing to form a second dielectric layer.

As shown in FIG. 11, a second dielectric layer 50 is formed over first conductive trace 48, 48' and first dielectric layer 40. The formation of second dielectric layer 50 may be achieved by any known process, including but not limited to film lamination, spin coating, roll coating and spray-on deposition and as set forth herein.

Figure 12:
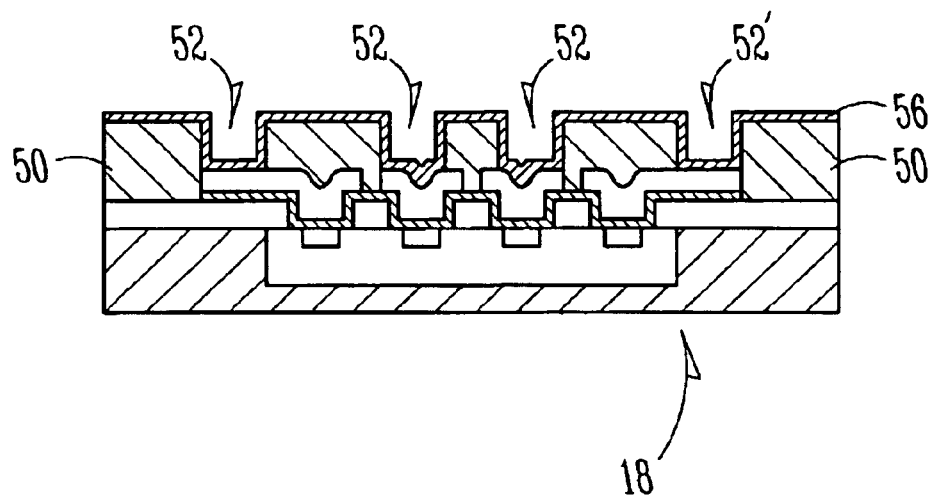
FIG. 12 is an elevational cross section view of the semiconductor structure depicted in FIG. 11 after further processing to form a second via and an optional second seed layer.

As shown in FIG. 12, a second via 52 is formed through second dielectric layer 50. Second via 52 may be formed by any method known in the art, including but not limited to laser drilling. If second dielectric layer 50 is photoactive, forming of second via 52 may be done in the same manner that a photoresist mask is made in a photolithographic process, as known in the art. Additionally, second via 52' is understood to be an opening into which at least a vertical or middle portion of an inductor can be formed.

The layering of dielectric layers and the formation of conductive traces can be repeated until the vias are in an appropriate position. Thus, portions of a single conductive trace be formed from multiple portions thereof and can reside on different dielectric layers.

Figure 13:
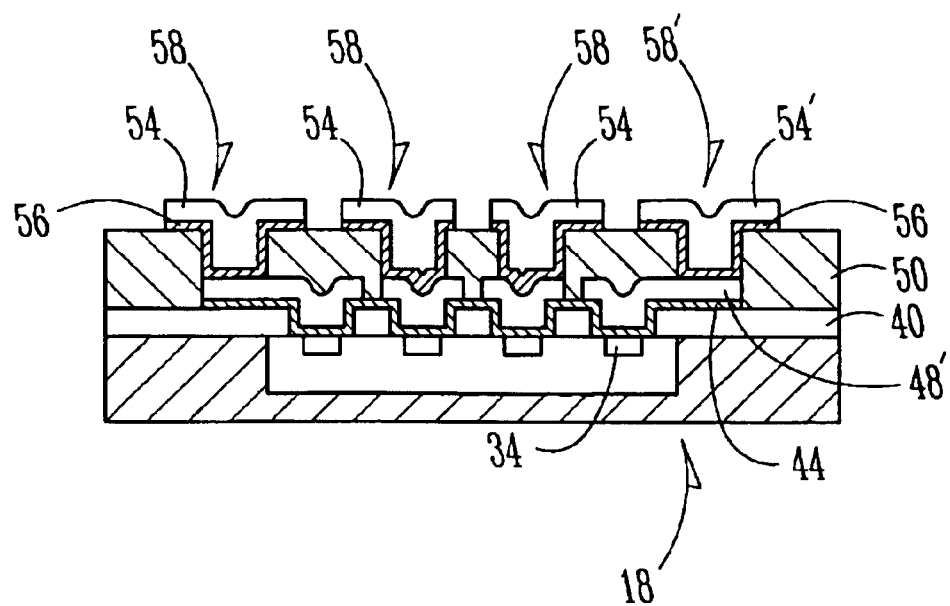
FIG. 13 is an elevational cross section view of the semiconductor structure depicted in FIG. 12 after further processing to form a second electrical trace and to complete an inductor structure.

A second conductive trace 54 and 54' may be formed as illustrated in FIG. 13, wherein a portion of each second conductive trace 54 extends into at least one of second via 52 or 52'. Additionally a second seed layer 56 may be formed in second via 52 and 52' similar to the manner of formation of first seed layer 44. Second conductive trace 54 each optionally include a landing pad 58. According to the inventive process, landing pad 58' portion of second conductive trace 54' may comprise an upper portion of an inductor as will be discussed further. According to the present invention, an inductor has been fabricated from several elements. These elements include the combination of the optional first seed layer 44 as it extends across boundary 18, first conductive trace 48', the optional second seed layer 56 as it extends across boundary 18, and second conductive trace 54'. The structure of the inductor will be further illustrated herein.

Regarding pin-out leads for the entire integrated package, they may be formed simultaneously with the inductor or semi-simultaneously as set forth herein. Once second conductive trace 54 and landing pad 58 are formed, they can be used in the formation of conductive interconnects or other structures. As such an optional third seed layer and a third conductive trace may be formed according to the inventive process. However, for the inventive process of forming an inductor, second conductive trace 54' and landing pad portion 58' may comprise a middle portion and an upper portion of an inductor. Alternatively, the second conductive trace 54' may have a substantially vertical post shape that comprises a middle portion of an inductor, and a third conductive trace with an optional third seed layer may be connected to comprise an upper portion of an inductor according to the present invention.

Figure 14:
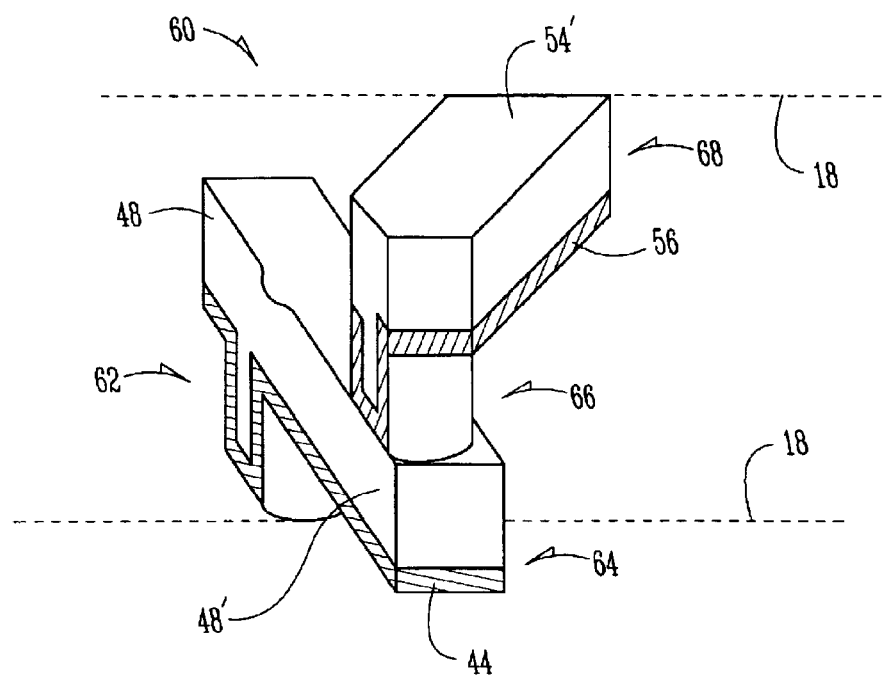
FIG. 14 is an elevational oblique view that illustrates a unit cell of a helical inductor.

FIG. 14 is an elevational oblique view that illustrates a unit cell 60 of a helical inductor that is made according to the present invention. FIG. 14 is also partially cut away to reveal optional layered structure therein. Additionally, for the unit cell 60 depicted in FIG. 14, approximate boundary 18 intersections with unit cell 60 are set forth. A portion of first seed layer 44 and first conductive trace 48 forms a first filled via 62 (the filled via being first via 42) that connects to a contact 34 as illustrated in FIG. 13. Another portion of first seed layer 44 and first conductive trace 48' forms a lower coil portion 64 that may be a substantially right rectangular body. A middle coil portion 66 is a substantially vertically oriented shape that includes structure from second seed layer 56 and second conductive trace 54'. Additionally, an upper coil portion 68 may be a substantially right rectangular body that includes structure from second seed layer 56 and second conductive trace 54'.

Figure 15:
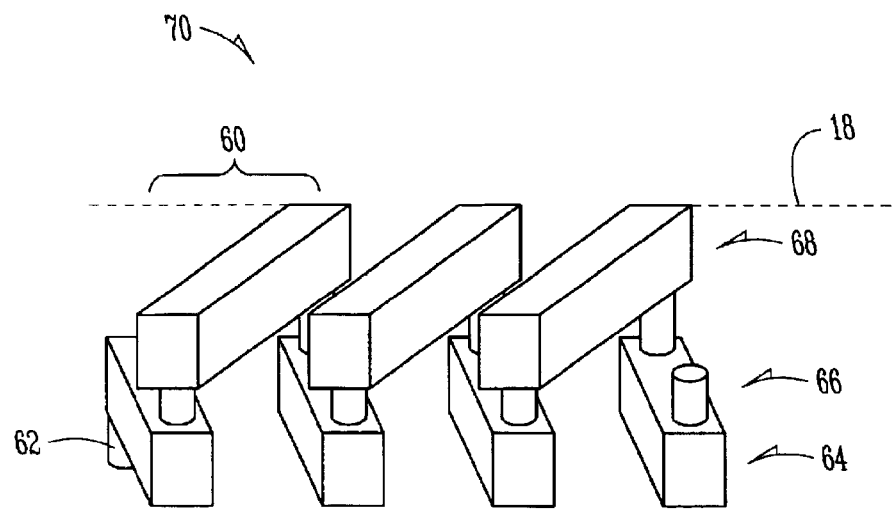
FIG. 15 is an elevational oblique view that illustrates a helical inductor.

FIG. 15 illustrates a helical inductor 70 that is made up of a plurality of unit cells 60. It is understood that helical inductor 70 includes first conductive trace 48' and second conductive trace 54'. It may include first seed layer 44 and second seed layer 56. As such, helical inductor 70 is made up of lower coil portion 64, middle coil portion 66, and upper coil portion 68. FIG. 15 also illustrates the presence of first filled via 62 where first filled via 62 represents a terminal end of helical inductor 70.

Figure 16:
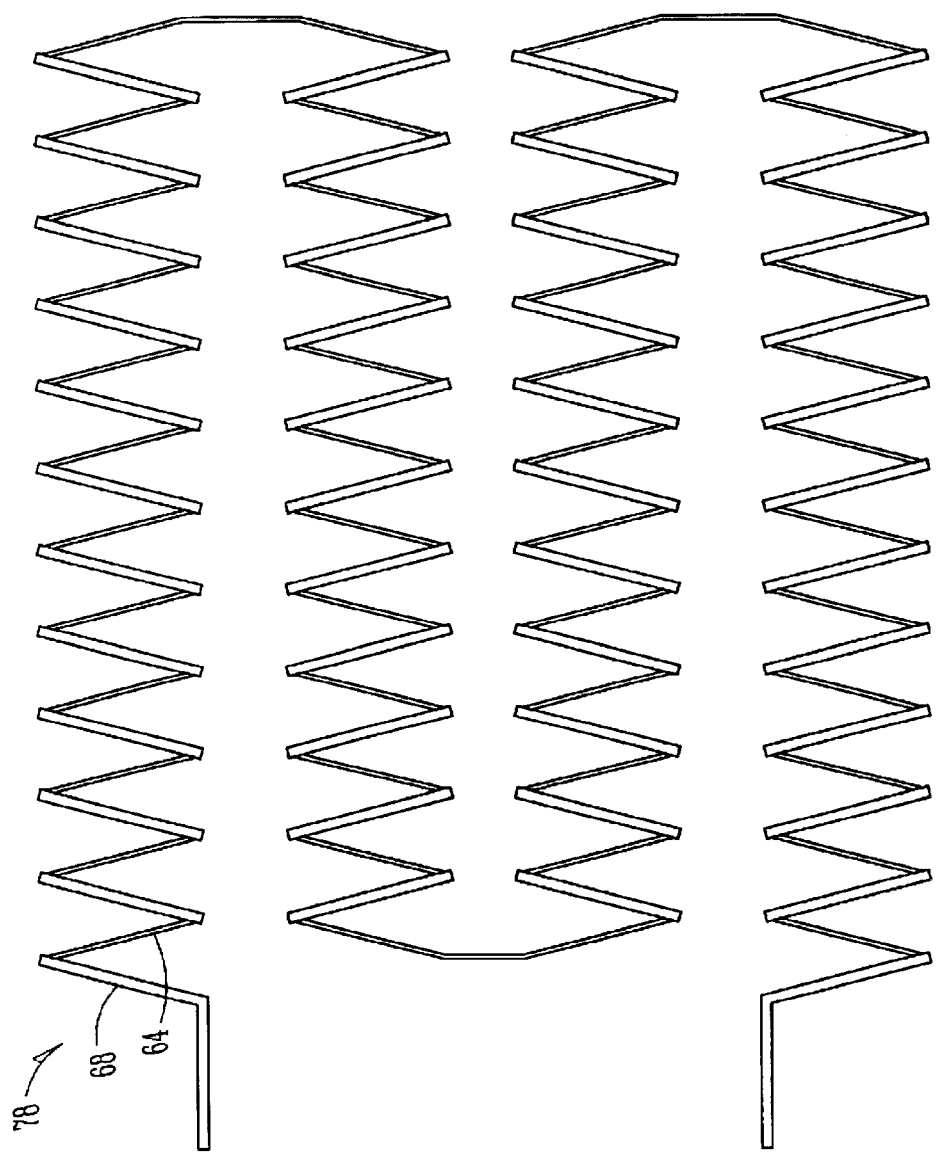
FIG. 16 is a top plan view of a folded helical inductor according to present invention.

FIG. 16 is a top plan schematic view of a folded helical inductor 78 where the light lines represent lower coil portion 64 and the heavy lines represent upper coil portion 68. Folded inductor 78 is fabricated according to the present invention during BUL processing as set forth herein.

Figure 17:
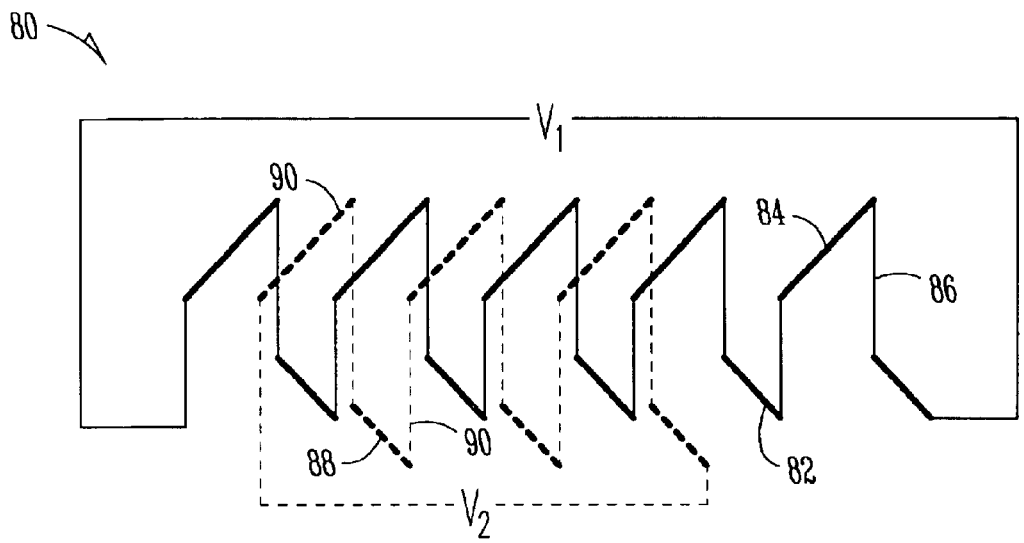
FIG. 17 is an elevational oblique schematic view of a transformer that comprises two interwound coils that are made according to the present invention.

FIG. 17 is an elevational oblique schematic view of a transformer 80 that uses interwound coils that are fabricated according to the present invention. As depicted, the heavy solid lines represent lower 82 and upper 84 sections of a first helix, and the light solid lines represent middle sections 86 of the first helix. Further, the heavy dashed lines represent lower 88 and upper 90 sections of a first interwound helix, and the light dashed lines represent middle sections 92 of the second interwound helix.

Figure 18:
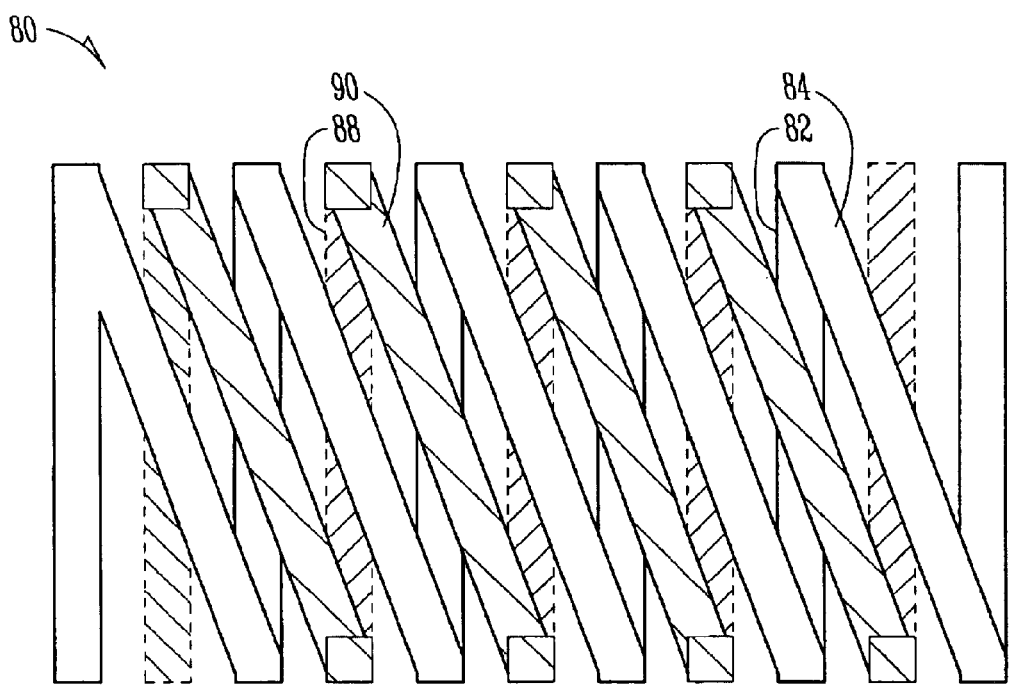
FIG. 18 is a top plan view of a transformer.

FIG. 18 illustrates a top plan view of transformer 80. Again, the solid lines represent lower 82 and upper 84 sections of a first helix and the heavy cross-hatched lines represent lower 88 and upper 90 sections of a first interwound helix. Spacing between the two interwound helixes may be on the order from about 1 micron to about 40 micron, preferably from about 10 micron to about 30 micron, and more preferably about 20 micron. For a 20-micron spacing, the length of lower and upper sections may be about 750 micron.

FIG. 19 is an elevational oblique view of a spiral coil inductor 92 that is made according to the present invention. Spiral coil inductor 92 is illustrated as a single turn for simplicity and that winds in a counter-clockwise direction, by way of non-limiting example. Additionally, for the spiral coil 92, approximate boundary intersections between a device with an active surface and a substrate with an inactive surface are set forth. It is also understood that a portion of first seed layer 44 (not pictured) and first conductive trace 48 forms a first filled via 94 (the filled via being first via 42) that connects to a contact 34 as illustrated in FIG. 13. Another portion of first seed layer 44 and first conductive trace 48 forms a lower coil portion 96 as a substantially right spiral body. A middle coil portion 98 is a post-shape that includes structure from second seed layer 56 (not pictured) and second conductive trace 54'. Additionally, an upper coil portion 100 is a substantially right spiral body that includes structure from second seed layer 56 and second conductive trace 54' and comprises a second filled via 102. FIG. 19 is a double coil where, in this instance, each spiral coil has a winding that expands in a clockwise direction.

It is understood that a spiral coil may also be made that has a single-level structure such that essentially a single metal layer in the build-up layer technology is used. Additionally, a spiral coil may be placed above front active surface 20 where the amount of electromagnetic noise that is generated thereby is not disruptive to the functionality of the circuitry within device 36.

FIGS. 20 and 21 illustrate schematic elevational oblique views of a counter coil 104 and double coil 114, respectively. Dielectric layers are not depicted, and they may even be stripped as a final embodiment. A first spiral 106 is made from first conductive trace 48' and optionally from first seed layer 44. A second spiral 108 is made from second conductive trace 54' and optionally from second seed layer 56. A three-dimensional counter coil 104 is formed by the deposition of second conductive trace 54'. The counter coil 104 has current entering from a first terminal 110 into first spiral 106, through the filled via portion of second conductive trace, and exiting second spiral 108 at a second terminal 112. Counter coil 104 is fabricated to allow the B-field that is set up between upper and lower coils, to oppose each other and therefore to potentially cancel each other in effect.

Double coil 114 as depicted in FIG. 21, is fabricated to allow the B-field that is set up between upper and lower coils, to aggregate. Accordingly, a first spiral 116 is made from first conductive trace 48' and optionally from first seed layer 44. A second spiral 118 is made from second conductive trace 54' and optionally from second seed layer 56. A three-dimensional double coil 114 is formed by the deposition of second conductive trace 54'. The double coil 114 has current entering from a first terminal 120 into first spiral 116 through the filled via portion of second conductive trace 54', and exiting second spiral 118 at a second terminal 122. Accordingly, second spiral 118 winds opposite first spiral 116.

Figure 22:
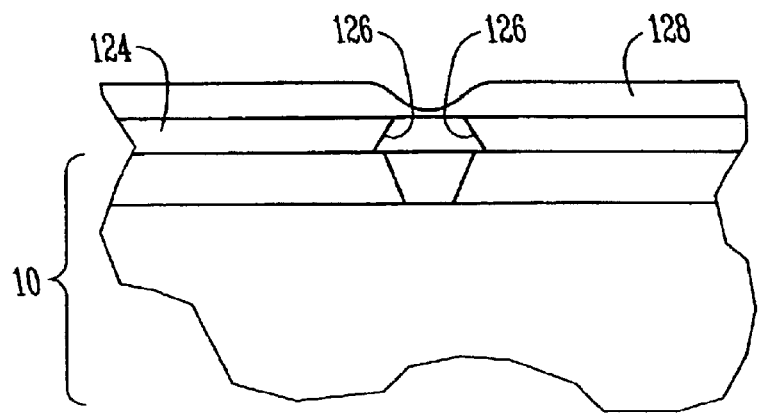
FIG. 22 is an elevational cross-section view of a semiconductor structure that is made according to the present invention.
Figure 23:
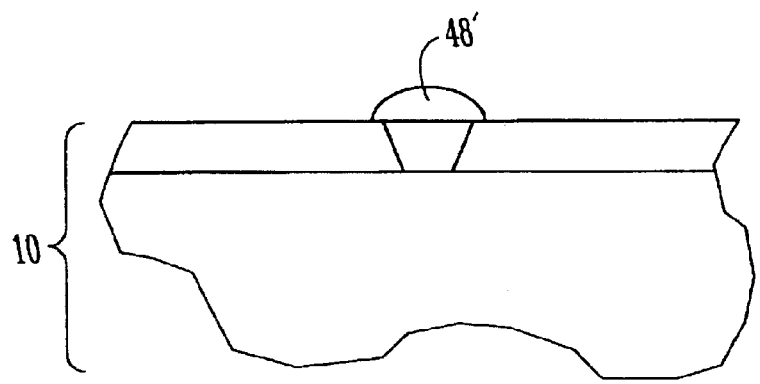
FIG. 23 is an elevational cross-section view of the semiconductor structure depicted in FIG. 22 after further processing.

In all of the above embodiments, fabrication of the inventive inductor may be accomplished by lift-off technology. In this embodiment, the inductor structure may be made by spinning on a first dielectric such as a polymer layer 124 on a substrate 10 and patterning of the polymer layer 124 may be done with a mask wherein patterning is carried out with a wet etch to create an undercut structure 126. Alternatively, polymer layer 124 may be photo active. Thereafter, deposition such as a copper layer 128 is accomplished as depicted in FIG. 22. At the site of undercut 126 on the mask, adhesion of copper layer 128 to substrate 10 such as to a contact in a dielectric layer, will only occur where the copper is bonded to another electrically conductive structure as depicted in FIG. 23 to form a first conductive trace 48'. Additional layers are made by repeating the wet-etch patterning of successive polymer layers to form at least a first conductive trace 48' and a second conductive tract 54'.

In all of the above embodiments, it is understood that either helical or spiral inductors may be fabricated at boundary 18. However, where the amount of noise that the inductor may generate is not disruptive of the proper function of circuitry on front active surface 20, such an inductor may be fabricated above front active surface 20. Two possible constraints for fabricating an inventive inductor above front active surface 20 are space available and a non-disruptive noise level.

Another aspect of the present invention relates to the specific time that the inventive inductors are fabricated. For example by use of wafer-scale packaging technology, the inventive process may be carried out before singulation of the individual packages. Additionally, the inventive process may be employed with making the inventive inductors upon a separate inactive substrate that may be electrically connected to the device by a technique such as flip chip packaging. In this manner, the inventive process may be employed both by build-up layer technology for components that are on separate inactive surfaces that are flip-chip bonded. In combination therewith, other components may be located also on either the active surface or the inactive surface at or near boundary 18. On other words, the inventive inductors or one type of them, may be found in any or all of a flip chip configuration to front active surface 20; upon front inactive surface 22; or in the build up layer above front active surface 20.

Figure 24:
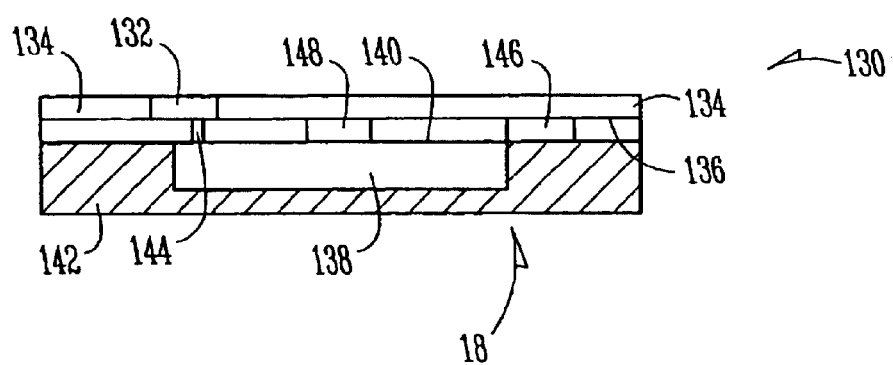
FIG. 24 illustrates alternative embodiments of the present invention.

FIG. 24 illustrates alternative embodiments of the present invention as discussed herein. In this embodiment, a process of making an inductor package 130 includes the flip-chip technology. In this method, an inductor 132 is formed upon a first substrate 134 having an inactive surface 136. First substrate 134 may be a flex board such as chip on flex (COF), or it may include BUL technology to form inductor. First substrate 134 may also be a silicon wafer or the like, flex material such as a Kapton® polyimide film. The process includes providing a device 138 comprising an active surface 140 over a second substrate 142. Second substrate 142 is understood to include device 138. The process also includes flip-chip connecting inductor 132 to device 138. By this process, where inductor 132 is disposed in first substrate 134, first substrate 134 is part of the flip-chip connection to device 138.

In another embodiment, electrical communication 144 is formed between inductor 132 and device 132 such as a bonding structure like a ball or solder bump. Where several inductors may be required, the inventive process may include patterning an inductor 146 on second substrate 142 at the boundary 18 as set forth herein. Additionally or alternatively, an inductor 148 may be patterned above active surface 140 where electrostatic noise is not unacceptable thereto.

It will be readily understood to those skilled in the art that various other changes in the details, material, and arrangements of the parts and process stages which have been described and illustrated in order to explain the nature of this invention may be made without departing from the principles and scope of the invention as expressed in the subjoined claims.

What is claimed is:

1. A process of forming an inductor comprising:
providing a substrate, wherein the substrate comprises at least one microelectronic device packaged therewith;
forming electrical communication for the at least one microelectronic device, wherein the electrical communication comprises at least two electrically conductive layers;
patterning an inductor on the substrate, wherein patterning an inductor on the substrate comprises:
forming first helical coil; and
forming a second helical coil that is interwound with the first helical coil; and connecting the inductor to the at least one microelectronic device.

2. The process according to claim 1, wherein providing a substrate comprises:
providing a first encapsulated device assembly, the first encapsulated device assembly having an active front surface, an inactive front surface, and a back surface.

3. The process according to claim 1, wherein patterning an inductor on the substrate comprises:
masking the active front surface of the first encapsulated device assembly during the patterning of the inductor.

4. The process according to claim 1, wherein patterning an inductor on the substrate comprises:

forming an inductor simultaneously while forming the electrical communication.

5. The process according to claim 1, wherein patterning an inductor on the substrate comprises:
   forming an inductor simultaneously while forming the electrical communication, wherein the inductor is made from at least two electrically conductive layers, and wherein at least one of the at least two electrically conductive layers is common to the electrical communication and the inductor.

6. The process according to claim 1, wherein patterning an inductor on the substrate comprises:
   forming an inductor on the inactive front surface.

7. The process according to claim 1, wherein patterning an inductor on the substrate comprises:
   forming a helical structure comprising at least two layers of electrically conductive material.

8. The process according to claim 1, wherein patterning an inductor on the substrate comprises:
   forming a substantially two-dimensional, spiral structure.

9. The process according to claim 1, wherein patterning an inductor on the substrate comprises:
   forming first spiral coil with a first spiral direction.

10. A process of forming an inductor comprising:
    providing a substrate, wherein the substrate comprises at least one microelectronic device packaged therewith;
    forming electrical communication for the at least one microelectronic device, wherein the electrical communication comprises at least two electrically conductive layers;
    patterning an inductor on the substrate, wherein patterning an inductor on the substrate comprises:
      forming first spiral coil with a first spiral direction; and
      forming a second coil with a second spiral direction that is wound opposite the first spiral direction; and
    connecting the inductor to the at least one microelectronic device.

11. The process according to claim 1, wherein patterning an inductor on the substrate comprises:
    forming a first dielectric layer on the substrate;
    patterning a first seed layer on the substrate;
    patterning a first conductive trace on the first seed layer;
    forming a second dielectric layer over the first conductive trace;
    patterning a second seed layer on the second dielectric layer; and
    patterning a second conductive trace over the second seed layer.

12. A process of forming an inductor comprising:
    providing a substrate, wherein the substrate comprises at least one microelectronic device packaged therewith;
    forming a first dielectric layer on the substrate;
    patterning a first seed layer on the substrate;
    patterning a first conductive trace on the first seed layer;
    forming a second dielectric layer over the first conductive trace;
    patterning a second seed layer on the second dielectric layer;
    patterning a second conductive trace over the second seed layer;
    forming first helical coil; and
    forming a second helical coil that is interwound with the first helical coil.

13. The process according to claim 12, wherein providing a substrate comprises:
    providing the first encapsulated microelectronic device assembly with an active front surface, an inactive front surface, and a back surface.

14. The process according to claim 12, further comprising:
    masking the active front surface of the first encapsulated device assembly during forming the inductor.

15. The process according to claim 13, further comprising:
    forming electrical communication of the front active surface; and
    forming the inductor simultaneously while forming the electrical communication.

16. The process according to claim 13, further comprising:
    forming electrical communication on the front active surface;
    forming the indicator simultaneously while forming the electrical communication, wherein the inductor is made from at least two electrically conductive layers, and wherein at least one of the at least two electrically conductive layers is common to the electrical communication and the inductor.

17. The process according to claim 13, wherein forming an inductor further comprises:
    forming a helical structure comprising at least two layers of electrically conductive material, wherein the at least two layers of electrically conductive material comprise the first conductive trace and the second conductive trace.

18. The process according to claim 12, wherein forming an inductor further comprises:
    forming a substantially two-dimensional, spiral structure, comprising at least two layers of electrically conductive material, wherein the at least two layers of electrically conductive material comprise the first conductive trace and the second conductive trace.

19. The process according to claim 12, wherein forming an inductor further comprises:
    forming a first spiral coil.

20. A process of forming an inductor comprising:
    providing a substrate, wherein the substrate comprises at least one microelectronic device packaged therewith;
    forming a first dielectric layer on the substrate;
    patterning a first seed layer on the substrate;
    patterning a first conductive trace on the first seed layer;
    forming a second dielectric layer over the first conductive trace;
    patterning a second seed layer on the second dielectric layer;
    patterning a second conductive trace over the second seed layer forming a first spiral coil; and
    forming a second spiral coil that winds opposite the first coil.

21. A process of forming an inductor comprising:
    providing a substrate, wherein the substrate comprises at least one microelectronic device packaged therewith;
    forming electrical communication for the at least one microelectronic device;
    forming a first dielectric layer on the substrate;
    patterning a first conductive trace over the first dielectric layer, wherein patterning comprises using lift-off technique;

forming a second dielectric layer over the first conductive trace;

patterning a second conductive trace over the second dielectric layer; and connecting the inductor to the at least one microelectronic device.

22. The process according to claim 12, further comprising:

before patterning a first conductive layer, patterning a first seed layer on the substrate; and before patterning a second conductive layer, patterning a second seed layer on the second dielectric layer.

23. A process of forming an inductor comprising:

providing a substrate, wherein the substrate comprises at least one microelectronic device packaged therewith;

forming electrical communication for the at least one microelectronic device;

forming a first dielectric layer on the substrate;

patterning a first conductive trace over the first dielectric layer, wherein patterning comprises using lift-off technique;

forming a second dielectric layer over the first conductive trace;

patterning a second conductive trace over the second dielectric layer; and connecting the inductor to the at least one microelectronic device.

24. A process of forming an inductor comprising:

providing a substrate, wherein the substrate comprises at least one microelectronic device packaged therewith, and wherein providing a substrate comprises:

providing the first encapsulated microelectronic device assembly with an active front surface, an inactive front surface, and a back surface, wherein the inductor is disposed at a border of the active front surface and the inactive front surface;

forming electrical communication for the at least one microelectronic device;

forming a first dielectric layer on the substrate;

patterning a first conductive trace over the first dielectric layer;

forming a second dielectric layer over the first conductive trace;

patterning a second conductive trace over the second dielectric layer; and connecting the inductor to the at least one microelectronic device.

25. A process of forming an inductor comprising:

providing a substrate, wherein the substrate comprises at least one microelectronic device packaged therewith, and wherein providing a substrate comprises:

providing the first encapsulated microelectronic device assembly with an active front surface, an inactive front surface, and a back surface, wherein the inductor is disposed at a border of the active front surface and the inactive front surface;

forming electrical communication for the at least one microelectronic device;

forming a first dielectric layer on the substrate;

patterning a first conductive trace over the first dielectric layer;

forming a second dielectric layer over the first conductive trace;

patterning a second conductive trace over the second dielectric layer; and connecting the inductor to the at least one microelectronic device.

* * * * *